United States Patent
Yano et al.

[11] Patent Number: 5,909,058
[45] Date of Patent: Jun. 1, 1999

[54] SEMICONDUCTOR PACKAGE AND SEMICONDUCTOR MOUNTING PART

[75] Inventors: Keiichi Yano; Hironori Asai, both of Yokohama; Kaoru Koiwa, Kawasaki; Nobuo Iwase, Kamakura, all of Japan

[73] Assignee: Kabushiki Kaisha Toshiba, Japan

[21] Appl. No.: 08/934,775

[22] Filed: Sep. 22, 1997

[30] Foreign Application Priority Data

Sep. 25, 1996 [JP] Japan .................................. 8-253019
Sep. 25, 1996 [JP] Japan .................................. 8-253020

[51] Int. Cl.$^6$ ................... H01L 23/34; H01L 23/48; H01L 23/29
[52] U.S. Cl. .................. 257/712; 257/703; 257/705; 257/738; 257/693
[58] Field of Search ........................ 257/712, 703, 257/705, 678, 684–686, 690, 693, 697, 698, 737, 738; 438/613; 228/180

[56] References Cited

U.S. PATENT DOCUMENTS

| | | | |
|---|---|---|---|
| 5,063,121 | 11/1991 | Sato et al. ................. | 428/698 |
| 5,126,824 | 6/1992 | Ueda ........................ | 257/668 |
| 5,229,213 | 7/1993 | Horiuchi et al. .......... | 428/457 |
| 5,541,145 | 7/1996 | Harris et al. .............. | 428/901 |
| 5,698,896 | 12/1997 | Komatsu et al. .......... | 257/705 |
| 5,729,051 | 3/1998 | Nakamura ................. | 257/668 |
| 5,763,939 | 6/1998 | Yamashita ................. | 257/668 |

OTHER PUBLICATIONS

H. Okoshi et al., "New BGA Package with AIN Heat–Spreader", International Microelectronics Conference Proceedings, pp. 24–27, Apr. (1996).

*Primary Examiner*—Mahshid Saadat
*Assistant Examiner*—Jhihan B. Clark
*Attorney, Agent, or Firm*—Finnegan, Henderson, Farabow, Garrett & Dunner, L.L.P.

[57] ABSTRACT

A thin type semiconductor package having a low thermal resistance and a low electric resistance is disclosed, that comprises a nitride ceramic supporting substrate having a first main surface and a second main surface, the nitride ceramic supporting substrate having via-holes that pass through from the first main surface to the second main surface, a resin film having a wiring layer, the resin film being bonded to the first main surface of the supporting substrate, the wiring layer being electrically connected to an edge portion of the via-holes on the first main surface, the resin film having an opening region, a semiconductor chip directly mounted on the first main surface of the nitride ceramic supporting substrate, disposed at the opening region of the resin film, and electrically connected to the wiring layer of the resin film, and external connection terminals disposed on the edge portion of the via-holes of the second main surface.

12 Claims, 4 Drawing Sheets

SEMICONDUCTOR PACKAGE AND SEMICONDUCTOR MOUNTING PART

BACKGROUND OF THE INVENTION

1. Field of the Invention

The present invention relates to a semiconductor package that is simply structured at low cost and to a semiconductor mounting part therewith.

2. Description of the Related Art

In recent years, as semiconductor fabrication technologies have been remarkably advanced, high integration and high power of semiconductor chips have been accomplished. Thus, the amount of heat generation of semiconductor chips has been correspondingly increased. In addition, the number of input/output signals per chip has been increased.

In these situations, packages that mount highly integrated semiconductor chips and so forth should effectively radiate heat generated by the semiconductor chips and have many terminals connected thereto at narrow pitches.

With respect to heat radiation of semiconductor packages, as portable electronic units and so forth have been advanced, heat radiation characteristic in natural convection state should be improved. In addition, as the sizes of electronic units are being decreased, the sizes of the semiconductor packages should be decreased.

In a conventional method for mounting a semiconductor chip with a large number of input/output terminals on a package, a semiconductor chip is bonded to a so-called TAB (Tape Automated Bonding) tape and the TAB tape is mounted on a package.

In the conventional package structure using the conventional TAB chip, however, the TAB chip is mounted on a package substrate composed of a multi-layered ceramic wiring board or a multi-layered resin wiring board. A wiring layer of the package substrate and TAB leads are connected. Thus, structurally, this package is expensive.

As another related art reference, an inexpensive package of which a TAB chip is sealed with a resin is known. However, in this structure, the heat radiation characteristic is remarkably low. Thus, this package cannot be used for such a highly integrated semiconductor chip and so forth.

As a further related art reference, a BGA (Ball Grid Array) type package using a TAB chip has been proposed. As shown in FIG. 7, in the BGA type package, a metal frame 3 or the like is bonded to a TAB tape 2 on which a semiconductor chip 1 is mounted so as to prevent so-called lead skewing such as bending and distortion of leads. However, in this structure, the heat radiation characteristic cannot be improved. Even if a heat radiation plate 4 is disposed at an upper portion of the metal frame 3, since a sealing resin 5 and so forth are disposed between the heat radiation plate 4 and the semiconductor chip 1, sufficient heat radiation characteristic cannot be obtained.

As a low heat resistance package with a high heat radiation characteristic, a so-called cavity-down structure type package has been proposed. In the cavity-down structure type package, as shown in FIG. 8, a semiconductor chip 1 is bonded on a lower surface side of a high heat radiation supporting substrate 6 composed of an aluminum nitride substrate or the like. A wiring portion 7 composed of a printed wiring board or the like is bonded on the same surface as the bonding surface of the semiconductor chip 1.

Although the cavity-down structure type package has; relatively high heat radiation characteristic, when the number of input/output signals increases, the package size becomes large. Thus, the requirement for decreasing the package size cannot be accomplished. In addition, as the package size increases, since the wiring length becomes long, electric characteristics such as wiring resistance and inductance degrade.

As described above, the conventional semiconductor packages that are simply structured at low cost have the following drawbacks. In the case of the package structure using a TAB chip, sufficient heat radiation characteristic cannot be obtained. In the case of the low heat resistance package having the cavity-down structure using the high heat radiation supporting substrate, when the number of input/output signals increases, the size of the package becomes large. Thus, the requirement for decreasing the package size cannot be satisfied. In addition, in this structure, electric characteristics are also degraded.

Thus, in the conventional semiconductor packages, the cost should be decreased in a relatively simple structure. In addition, both the improvement of heat radiation characteristic and the decrease of the package size should be satisfied. Moreover, the electric characteristics should be improved.

SUMMARY OF THE INVENTION

The present invention is made from the above-described point of view. An object of the present invention is to provide a semiconductor package and a semiconductor mounting part therewith that allow the number of input/output signals to increase, the package size to decrease, and excellent heat radiation characteristic and electric characteristics to be satisfied.

A first aspect of the present invention is a thin type semiconductor package having a low thermal resistance and a low electric resistance, comprising a nitride ceramic supporting substrate having a first main surface and a second main surface, the nitride ceramic supporting substrate having via-holes that pass through from the first main surface to the second main surface, a resin film having a wiring layer and bonded to the first main surface of the supporting substrate, the wiring layer being electrically connected to an edge portion of the via-holes on the first main surface, the resin film having an opening region, a semiconductor chip directly mounted on the first main surface of the nitride ceramic supporting substrate, disposed at the opening region of the resin film, and electrically connected to the wiring layer of the resin film, and external connection terminals disposed on the edge portion of the via-holes of the second main surface.

A second aspect of the present invention is a thin type semiconductor package having a low thermal resistance and a low electric resistance, comprising a nitride ceramic supporting substrate having a first main surface and a second main surface, the nitride ceramic supporting substrate having via-holes that pass through from the first main surface to the second main surface, a TAB tape having a wiring layer and bonded to the first main surface of the supporting substrate, the wiring layer being electrically connected to an edge portion of the via-holes on the first main surface, a semiconductor chip directly mounted on the first main surface of the nitride ceramic supporting substrate, disposed at an opening region of the TAB tape, and electrically connected to the wiring layer of the TAB tape, and external connection terminals disposed on the edge portion of the via-holes of the second main surface.

In the semiconductor packages of the first aspect and the second aspect, the via-holes and the wiring layer of the resin film or the TAB tape are electrically connected through the bumps disposed on the first main surface of the nitride ceramic supporting substrate.

In the semiconductor packages of the first aspect and the second aspect, the external connection terminals are bump terminals, the nitride ceramic supporting substrate having heat radiation dummy bumps other than the bump terminals as the external connection terminals.

A third aspect of the present invention is a semiconductor mounting part, comprising the semiconductor package of the first aspect or the second aspect of the present invention, and a multi-layered mounting substrate for mounting the semiconductor package, the multi-layered mounting substrate having a wiring layer electrically connected to external connection terminals of the semiconductor package.

According to the semiconductor package of the first aspect of the present invention, since signal lines are mainly formed of the wiring layer of the resin film bonded to the supporting substrate, and signal lines provided in the supporting substrate of a nitride ceramic are basically only via-holes, the package can be simply structured. Thus, the cost of the semiconductor package can be decreased.

According to the semiconductor package of the second aspect of the present invention, since signal lines are mainly formed of the wiring layer of the TAB tape bonded to the supporting substrate and signal lines on the supporting substrate of a nitride ceramic are basically only via-holes, the package can be simply structured. In other words, the cost of the semiconductor package can be decreased.

In addition, both the semiconductor packages of the first and second aspects of the present invention have a so-called cavity-up structure. Moreover, the wiring layer of the resin film or the TAB tape can be structured in high density. The semiconductor packages can be connected to semiconductor chips with many input/output signals at narrow pitches. Thus, the sizes of the semiconductor packages can be decreased.

Moreover, since a semiconductor chip is directly mounted on the supporting substrate of a nitride ceramic having an excellent thermal conductive characteristic, heat of the semiconductor chip is effectively radiated. Thus, the high heat radiation characteristic of the semiconductor package can be secured.

Furthermore, as the package size becomes small, the length of signal lines can be decreased. As the wiring material of the resin film and the TAB tape, Cu or the like can be used. Thus, the resistance and inductance of the signal lines can be decreased.

In addition, since the resin film made of an insulation resin or the like and the TAB tape consisting of polyimide resin have the lower dielectric constant compared with the ceramic substrate, the capacitance between each signal line can be decreased. Thus, the electric characteristics of the semiconductor package can be improved.

When via-holes of the supporting substrate and the wiring layer of the resin film or the TAB tape are electrically connected through bumps disposed on the supporting substrate, the difference of the coefficient of thermal expansion between the supporting substrate and the resin film or the TAB tape can be alleviated. Thus, the reliability of the package can be further improved.

When heat radiation dummy bumps other than bump terminals as external connection terminals are disposed on the supporting substrate, the heat radiation characteristic of the mounting substrate on which the semiconductor package is mounted can be improved. Thus, the heat radiation characteristic of the semiconductor package can be further improved.

These and other objects, features and advantages of the present invention will become more apparent in light of the following detailed description of a best mode embodiment thereof, as illustrated in the accompanying drawings.

DESCRIPTION OF PREFERRED EMBODIMENTS

Embodiment 1

Figure 1:
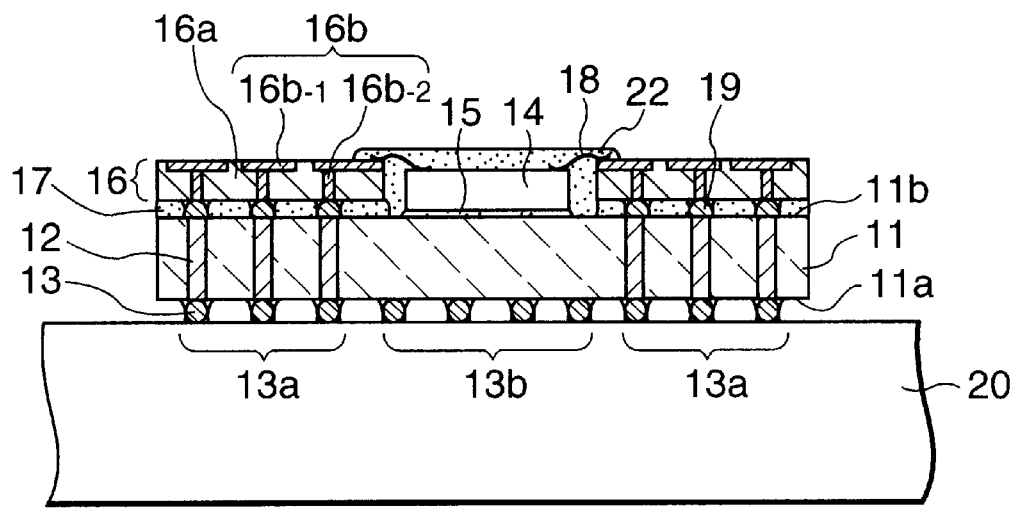
FIG. 1 is a sectional view showing the structure of a semiconductor package according to a first embodiment of the present invention.

FIG. 1 is a sectional view showing the structure of a semiconductor package according to a first embodiment of the present invention. In FIG. 1, reference numeral 11 is a supporting substrate. The supporting substrate 11 is composed of a sintered substance of aluminum nitride (AlN) or silicon nitride ($Si_3N_4$).

The thermal conductivity of the AlN sintered substance of the supporting substance 11 is preferably 80 W/m·K or more.

The thermal conductivity of the $Si_3N_4$ sintered substance is preferably 50 W/m·K or more. The $Si_3N_4$ sintered substance is known as a hard and tough ceramic sintered substance. When fine and highly purified silicon nitride powder as the material of the sintered substance is used and a sintering accelerating agent is added thereto, the $Si_3N_4$ sintered substance with an excellent thermal conductivity of 50 W/m·K can be obtained without losing hard and tough mechanical characteristics.

The supporting substrate 11 composed of the above-described nitride ceramic substrate has via-holes 12 as internal signal lines. The via-holes 12 are formed in the following manner. In the green sheet forming step of the nitride ceramic substrate, through-holes are formed. The through-holes are filled with a conductive paste containing W. Mo, or the like and then sintered with the green sheet. Thus, the via-holes 12 are composed of a metal with a high melting point and form a conductor layer.

The supporting substrate 11 is composed of an inexpensive single plate type substrate. The supporting substrate 11 has only the via-holes 12 that are relatively easily formed as internal signal lines.

As will described later, a wiring layer such as a power supply layer, a ground layer, and so forth may be disposed in the supporting substrate 11. In this case, a multi-layered nitride ceramic substrate can be used for the supporting substrate 11.

Bump terminals 13 (hereinafter referred to as solder bumps) are disposed on a second main surface (namely, a lower surface 11a) of the supporting substrate 11 that has the above-described via-holes 12. The bump terminals are formed of, for example, solder balls. The solder bumps 13 mainly function as external connection terminals.

The solder bumps 13a as the external connection terminals are electrically connected to the via-holes 12. Part of solder bumps 13 are bonded to the lower surface 11a of the supporting substrate 11 regardless of the positions of the via-holes 12.

The solder bumps 13b that are not electrically connected are heat radiation dummy bumps, thereby contributing to increasing the contact area with a mounting substrate 20 (that will be described later). Since the dummy bumps 13b are formed in such a manner that they do not affect the positions of the solder bumps 13a as the external connection terminals, the heat radiation area of which heat is radiated from the supporting substrate 11 to the mounting substrate 20 can be increased. Thus, the thermal characteristic (heat radiation characteristic) of the package can be further improved.

The solder bumps 13 are formed in the following manner. A Sn-Pb eutectic solder paste or the like is printed at the positions of the via-holes 12 and a blank space where the via-holes 12 are not formed on the second main surface (namely, the lower surface 11a) of the supporting substrate 11. Sn-Pb eutectic solder balls are placed on the Sn-Pb eutectic solder paste and then solder paste is melted.

A semiconductor chip 14 such as a CMOS gate array or an ECL gate array is bonded and mounted on the first main surface (namely, the upper surface 11b) of the supporting substrate 11 through a bonding material 15 such as brazing material, solder, or glass type bonding agent. Heat generated by the semiconductor chip 14 is directly transferred to the supporting substrate 11. Thus, heat of the semiconductor chip 14 can be effectively transferred to the supporting substrate 11 composed of the nitride ceramic substrate that has a high thermal conductivity. The semiconductor package according to the embodiment has a so-called cavity-up structure.

A resin film 16 having a wiring layer 16b is bonded and secured to the bonding and mounting surface (first main surface) 11b for the semiconductor chip 14 on the supporting substrate 11. The resin film 16 has an opening in an area to which the semiconductor chip 14 is mounted.

The resin film 16 is in advance formed by disposing the wiring layer 16b composed of a copper foil or a copper alloy foil on or in an insulation film 16a composed of a conventional glass epoxy resin or the like. The wiring layer 16b has a plane conductor portion 16b-1 and a through-hole conductor portion 16b-2. One end portion of the plane conductor portion 16b-1 of the wiring layer 16b is electrically connected to electrodes (not shown) of the semiconductor chip 14 through bonding wires 18. Signal lines of the semiconductor chip 14 are basically wired on the wiring layer 16b of the resin film 16.

As described above, since the wiring layer 16b of the resin film 16 uses copper, copper alloy, or the like, signal lines can be formed at narrow pitches. By using the wiring layer 16b, the semiconductor chip 14 and the wiring layer 16b can be connected with many terminals at narrow pitches.

In addition, since the wiring layer 16b of the resin film 16 allows signal lines to be disposed in high density due to narrow pitches, signal lines of the semiconductor chip 14 with many input/output terminals can be easily wired. In addition, the package size can be decreased.

Figure 2:
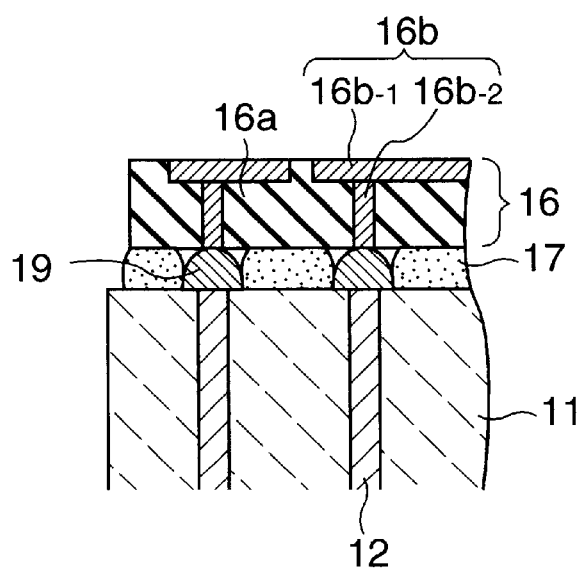
FIG. 2 is an enlarged view showing a connected portion of a supporting substrate and a resin film of the semiconductor package shown in FIG. 1.

The other end portion of the wiring layer 16b of the resin film 16 (namely, the edge portion of the lower surface of the through-hole conductor portion 16b-2) is electrically connected to the edge portion of the first main surface of the via-holes 12 in the supporting substrate 11. As shown in FIG. 2 (that is an enlarged sectional view of FIG. 1), the wiring layer 16b and the via-holes 12 of the supporting substrate 11 are electrically connected through the bumps 19 disposed on the first main surface 11b of the supporting substrate 11.

The semiconductor chip 14 and bonding wires 18 are sealed and protected with a potting resin 22.

The electrical connection of the wiring layer 16b and the via-holes 12 with the above-described bumps 19 and the mechanical contact of the supporting substrate 11 and the resin film 16 with insulation bonding agent 17 are performed in the following manner. First of all, the bumps 19 are formed on the via-holes 12 of the supporting substrate 11. After applying the insulation bonding agent 17 to the supporting substrate 11 except for the positions of the bumps 19, the supporting substrate 11 and the resin film 16 are aligned and bonded.

The bumps 19 function as a stress alleviating layer of the supporting substrate 11 and the resin film 16. The stress alleviating effect is proportional to the height of the bumps 19. Thus, although the supporting substrate 11 and the resin film 16 whose coefficients of thermal expansion thereof are different are bonded, the stress generated at the bonded portion is alleviated and thereby the reliability of the electric connection is improved. In addition, the reliability of the electrical connection of the wiring layer 16b and the via-holes 12 is improved.

The semiconductor package is mounted on the multi-layered mounting substrate 20 such as a multi-layered printed wiring board. The solder bumps 13a as external connection terminals of the semiconductor package are electrically connected to a wiring layer (not shown) of the mounting substrate 20. Thus, a semiconductor mounting part is composed.

In the semiconductor package according to the above-described embodiment and the semiconductor mounting device therewith, the signal lines are disposed on the wiring layer 16b of the resin film 16. The signal lines on the supporting substrate 11 are only the via-holes 12. In addition, since the supporting substrate 11 is composed of an inexpensive single plate type nitride ceramic substrate, a simple package structure is accomplished. Thus, the cost of the package can be decreased.

In addition, the package has a so-called cavity-up structure. Moreover, since the wiring layer 16b of the resin film can be structured in high density, the semiconductor chip with many input/output signals is connected to the resin film 16 with many terminals at narrow pitches and thereby the package size can be decreased. In other words, in addition to the increase of the number of input/output signals of the semiconductor chip 14, the package size thereof can be decreased.

As the package size becomes small, the length of the signal lines can be decreased. In addition, as the wiring material of the resin film 16, since Cu or the like can be used, the resistance and inductance of the signal lines can be decreased. These features are especially effective for the semiconductor chip 14 that operates at a high frequency.

Moreover, the dielectric constant of the ceramic material such as aluminum nitride or silicon nitride is around 9, whereas the dielectric constant of glass epoxy resin or the like used for the insulation film 16a of the resin film 16 is as low as 3. Thus, the capacitance between each signal line can be remarkably decreased. The decrease of the capacitance between each signal line allows, for example, cross-talk noise to decrease.

In the semiconductor package according to the embodiment, the resistance and inductance of the signal lines are decreased. In addition, the capacitance between each signal line is decreased. Thus, the semiconductor package having excellent electric characteristics that prevent the semiconductor chip 14 from malfunctioning and improve operation characteristics of the semiconductor chip 14 operating at a high frequency can be provided.

Moreover, with respect to the heat radiation characteristic of the semiconductor package, since the semiconductor chip 14 is directly mounted on the supporting substrate 11 composed of a nitride ceramic substrate that has an excellent thermal conductivity, heat generated in the semiconductor chip 14 can be directly radiated from the front surface of the supporting substrate 11.

Figure 8:
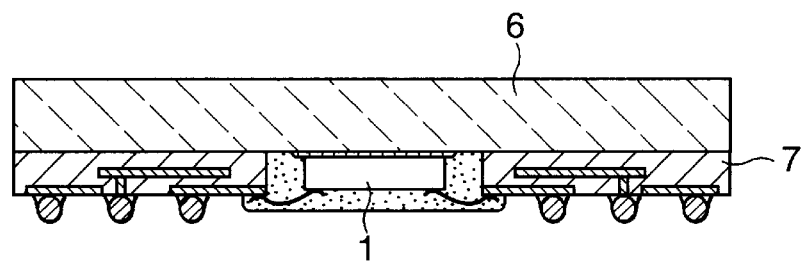
FIG. 8 is a sectional view showing an example of a low heat resistance package having a conventional cavity-down structure.
Figure 9:
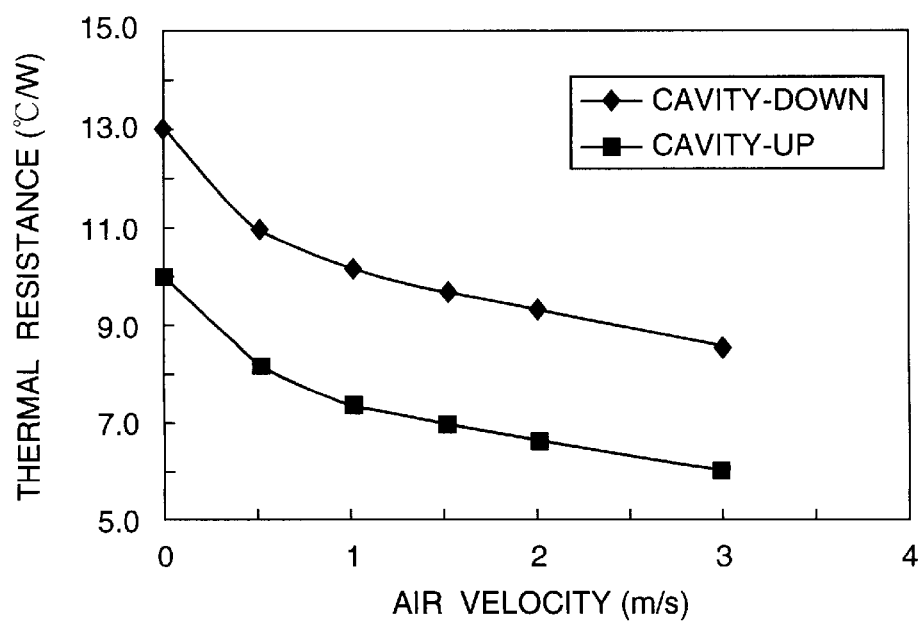
FIG. 9 is a schematic diagram showing the difference of thermal resistance between BGA having a first cavity-up structure according to the present invention and BGA having the conventional cavity-down structure.

As test results of thermal resistance of a resin ceramic complex BGA having the cavity-up structure according to the embodiment and a BGA having the conventional cavity-down structure shown in FIG. 8, the thermal resistance of the BGA having the conventional structure was 13° C./W, whereas the thermal resistance of the BGA according to the embodiment was 10° C./W. Thus, in the embodiment, the thermal resistance was decreased by 23%. FIG. 9 shows test results of thermal resistance in the condition that the air velocity was varied. Thus, FIG. 9 shows that the thermal resistance of the resin ceramic complex BGA having the cavity-up structure according to the embodiment is remarkably improved in comparison with the thermal resistance of the BGA having the conventional cavity-down structure.

The thermal resistance of the BGA according to the embodiment was equal to the thermal resistance of the BGA having the cavity-up structure composed of a single AlN substance.

In addition, the electric characteristics of the resin ceramic complex BGA having the cavity-up structure according to the embodiment were compared with the electric characteristics of the BGA having the cavity-up structure composed of the single AlN substance. The test results show that the wiring resistance of the BGA composed of the single AlN substance was 1.5 Ω, whereas the wiring resistance of the BGA according to the embodiment was 350 mΩ (thus, around ¼). This is because the single AlN substance should use W with a high electric resistivity (5.5 μΩ·cm), whereas the resin ceramic complex BGA having the cavity-up structure according to the embodiment contains Cu with a low electric resistivity (1.673 μΩ·cm).

On the other hand, the parasitic capacitance of the single AlN substance was 2.5 pF, whereas the parasitic capacitance of the BGA according to the embodiment was as low as 0.9 pF. This is because the dielectric constant of the single AlN substance was 8.6, whereas the dielectric constant of the resin according to the embodiment was as low as 2.9.

When a multi-layered substrate such as a multi-layered printed wiring board that has a high heat radiation characteristic is used for the mounting substrate 20 that mounts the semiconductor package, heat generated by the semiconductor chip 14 can be properly radiated to the mounting substrate 20 through the solder bumps 13. Thus, the heat radiation characteristic of the semiconductor package can be improved. Since the heat radiation dummy bumps 13b are disposed on the supporting substrate 11, the connected area of the supporting substrate 11 and the mounting substrate 20 (namely, the heat radiation area) increases. Thus, the heat radiation efficiency of which heat is radiated to the mounting substrate 20 increases, thereby improving the heat radiation characteristic of the semiconductor package.

Thus, the semiconductor package according to the embodiment satisfies all the requirements of simple structure at low cost, increase of the number of input/output signals, the decrease of package size, high heat radiation characteristic, and excellent electric characteristics. In addition, when the semiconductor mounting device having the mounting substrate 20 that is a multi-layered substrate is used, the heat radiation characteristic can be further improved.

In the above-described embodiment, the structure of which the resin film 16 is composed of a single wiring layer was explained. However, the present invention is not limited to such a structure. For example, as shown in FIG. 3, a multi-layered wiring film 21 may be used.

Figure 3:
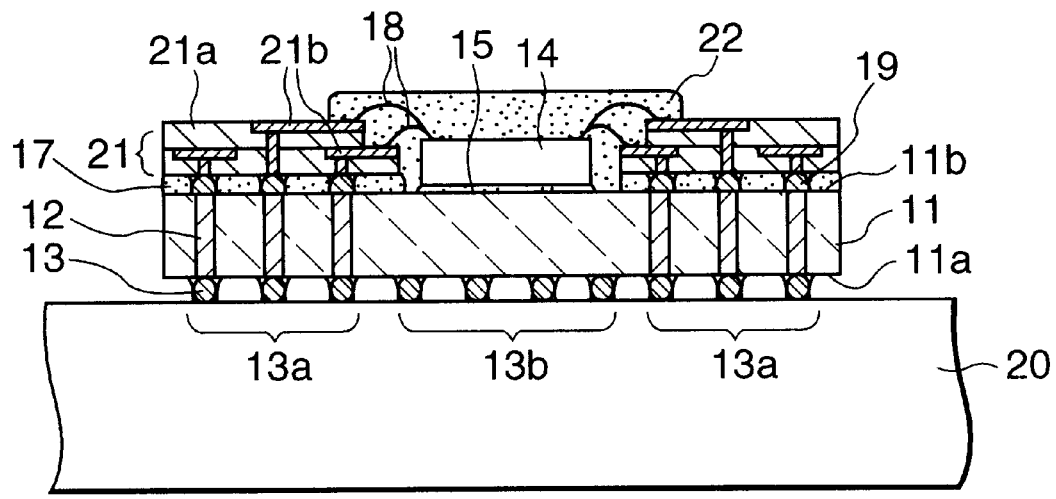
FIG. 3 is a sectional view showing the structure of the semiconductor package according to a modification of the first embodiment of the present invention.

In the semiconductor package shown in FIG. 3, signal lines are disposed on and in a multi-layered wiring layer 21b of the multi-layered wiring film 21. A semiconductor chip 14 and the wiring layer 21b are electrically connected through bonding wires 18. In FIG. 3, reference numeral 21a is an insulation film that is the same as the resin film 16.

By using the multi-layered wiring film 21, signal lines can be wired in high density. Thus, the package size can be further decreased. Alternatively, the number of input/output signals of the semiconductor chip 14 can be increased.

In addition, as described above, the supporting substrate 11 may be composed of a multi-layered nitride ceramic substrate having a power supply layer, a ground layer, and so forth. With the multi-layered nitride ceramic substrate having only the power supply layer, the ground layer, and so forth besides the via-holes 12, the requirement of the low cost of the semiconductor package can be sufficiently satisfied. In this case, it is preferred that the power supply layer, the ground layer, and so forth are flatly formed in the supporting substrate 11. Thus, the wiring resistance of the power supply layer, the ground layer, and so forth can be decreased. When the power supply layer and the ground layer in the supporting substrate are flatly formed, the wiring layer 16b of the resin film 16 is formed as a micro-strip structure. Thus, since the characteristic impedance can be controlled, signals can be prevented from reflecting and ringing. Consequently, with the semiconductor package according to the present invention, the semiconductor chip thereon stably operates at a high frequency of 800 HMz.

In the above-described embodiment, the structure of which the semiconductor chip 14 is mounted on the upper surface 11b of the supporting substrate 11 was explained. However, the present invention is not limited to such a structure. Instead, a nitride ceramic substrate with a cavity formed in a concave shape can be used for the supporting substrate 11. When the cavity type nitride ceramic substrate is used, the same effects as the package structures shown in FIGS. 1 and 3 can be obtained.

Second Embodiment

Figure 4:
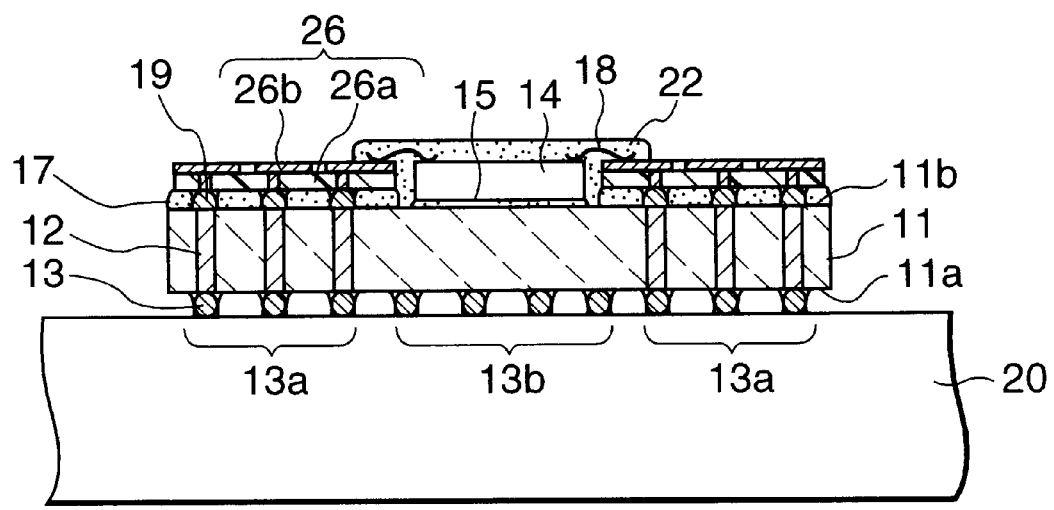
FIG. 4 is a sectional view showing the structure of a semiconductor package according to a second embodiment of the present invention.

Next, with reference to FIGS. 4 and 5, a semiconductor package according to a second embodiment of the present invention will be described.

Figure 5:
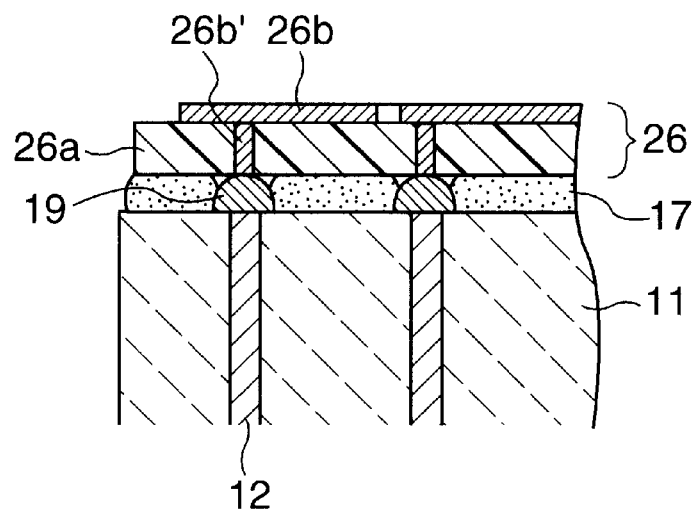
FIG. 5 is an enlarged sectional view showing a connected portion of a supporting substrate and a TAB tape of the semiconductor package shown in FIG. 4.

FIG. 5 is an enlarged sectional view showing the structure of the semiconductor package according to the second embodiment of the present invention. In FIG. 5, reference numeral 11 is a supporting substrate. The semiconductor package according to the second embodiment has the same nitride ceramic substrate as the semiconductor package according to the first embodiment. In addition, the structure of the nitride ceramic substrate according to the second embodiment is the same as the structure of the nitride ceramic substrate according to the first embodiment.

Solder bumps 13a and dummy bumps 13b for heat radiation are disposed on a second main surface 11a of the supporting substrate 11.

A semiconductor chip 14 is bonded and mounted on a first main surface 11b of the supporting substrate 11 through a bonding material 15 such as brazing materials, solder, or glass type bonding agent.

A TAB (Tape Automated Bonding) tape 26 is bonded and secured on the first main surface 11b of the supporting substrate 11 through an insulation bonding agent 17. The TAB 26 is composed of a tape carrier 26a as an insulation resin film such as a polyimide film and a wiring layer 26b of such as copper or copper alloy formed thereon.

An end portion of the wiring layer 26b of the TAB tape 26 is electrically connected to electrodes (not shown) of the semiconductor chip 14 through bonding wires. Signal lines of the semiconductor chip 14 are basically wired with the wiring layer 26b of the TAB tape 26.

Since the wiring layer 26b of the TAB tape 26 are composed of copper or copper alloy, they can be finely etched. In reality, the wiring layer 26b can be formed at pitches of 0.05 to 0.5 mm. By using the wiring layer 26b, the semiconductor chip 14 and the wiring layer 26b can be connected with many terminals at narrow pitches.

Since the wiring layer 26b of the TAB tape 26 are wired in high density at narrow pitches, even if the semiconductor chip has many input/output terminals, signal lines can be easily disposed. In addition, the package size can be decreased.

The other end portion of the wiring layer 26b of the TAB tape 26 is electrically connected to the edge portion of the upper surface of the via-holes 12. As with the first embodiment, the wiring layer 26b and the via-holes 12 are electrically connected through bumps 19 disposed on the first main surface 11b of the supporting substrate 11. In addition, the semiconductor chip 14 and the bonding wires 18 are sealed and protected with a potting resin 22.

The electrical connection of the wiring layer 26b and the via-holes 12 with the above-described bumps 19 and the mechanical contact of the supporting substrate 11 and the TAB tape 26 with insulation bonding agent 17 are performed in the following manner. First of all, the bumps 19 are formed on the via-holes 12 of the supporting substrate 11. After applying the insulation bonding agent 17 to the supporting substrate 11 except for the positions of the bumps 19, the supporting substrate 11 and the TAB tape 26 are aligned and bonded.

The bumps 19 function as a stress alleviating layer of the supporting substrate 11 and the TAB tape 26. The stress alleviating effect is proportional to the height of the bumps 19. Thus, although the supporting substrate 11 and the TAB tape 26 whose coefficients of thermal expansion thereof are different are bonded, the stress generated at the bonded portion is alleviated and thereby the reliability of the connection is improved. In addition, the reliability of the electrical connection of the wiring layer 26b and the via-holes 12 is improved.

As with the above-described first embodiment of the present invention, the semiconductor package is mounted on the multi-layered mounting substrate 20 such as a multi-layered printed wiring board. The solder bumps 13a as external connection terminals of the semiconductor package are electrically connected to a wiring layer (not shown) of the mounting substrate 20. Thus, a semiconductor mounting device is composed.

In the semiconductor package according to the above-described embodiment and the semiconductor mounting device therewith, the signal lines are wired on the wiring layer 26b of the TAB tape 26. The signal lines on the supporting substrate 11 are only the via-holes 12. In addition, since the supporting substrate 11 is composed of an inexpensive single plate type nitride ceramic substrate, a simple package structure is accomplished. Thus, the cost of the package can be decreased.

In addition, the package has a so-called cavity-up structure. Moreover, since the wiring layer 26b of the TAB tape 26 can be structured in high density, the semiconductor chip with many input/output signals is connected to the TAB tape 26 with many terminals at narrow pitches and thereby the package size can be decreased. In other words, in addition to the increase of the number of input/output signals of the semiconductor chip 14, the package size thereof can be decreased.

As the package size becomes small, the length of the signal lines can be decreased. In addition, as the wiring material of the TAB tape 26, since Cu or the like can be used, the resistance and inductance of the signal lines can be decreased. These features are especially effective for the semiconductor chip 14 that operates at a high frequency.

Moreover, the dielectric constant of the ceramic material such as aluminum nitride or silicon nitride is around 9, whereas the dielectric constant of an insulation resin film 26a such as a polyimide resin film used for the TAB tape 26 is as low as 3. Thus, the capacitance between each signal line can be remarkably decreased. The decrease of the capacitance between each signal line allows for example cross-talk noise to decrease.

In the semiconductor package according to the embodiment, the resistance and inductance of the signal lines are decreased. In addition, the capacitance between each signal line is decreased. Thus, the semiconductor package having excellent electric characteristics that prevent the semiconductor chip 14 from malfunctioning and improve operation characteristics of the semiconductor chip 14 operating at a high frequency can be provided.

Moreover, with respect to the heat radiation characteristic of the semiconductor package, since the semiconductor chip 14 is directly mounted on the supporting substrate 11 composed of a nitride ceramic substrate that has an excellent thermal conductivity, heat generated in the semiconductor chip 14 can be directly radiated from the front surface of the supporting substrate 11.

As with the first embodiment, when a multi-layered substrate such as a multi-layered printed wiring board that has a high heat radiation characteristic is used for the mounting substrate 20 that mounts the semiconductor package, heat generated by the semiconductor chip 14 can be properly radiated to the mounting substrate 20 through the solder bumps 13. Thus, the heat radiation characteristic of the semiconductor package can be improved. Since the heat radiation dummy bumps 13b are disposed on the supporting substrate 11, the connected area of the supporting substrate 11 and the mounting substrate 20 (namely, the heat radiation area) increases. Thus, the heat radiation efficiency of which heat is radiated to the mounting substrate 20 increases, thereby improving the heat radiation characteristic of the semiconductor package.

Thus, the semiconductor package according to the embodiment satisfies all the requirements of simple structure at low cost, increase of the number of input/output signals, the decrease of package size, high heat radiation characteristic, and excellent electric characteristics. In addition, when the semiconductor mounting device having the mounting substrate 20 that is a multi-layered substrate is used, the heat radiation characteristic can be further improved.

Figure 6:
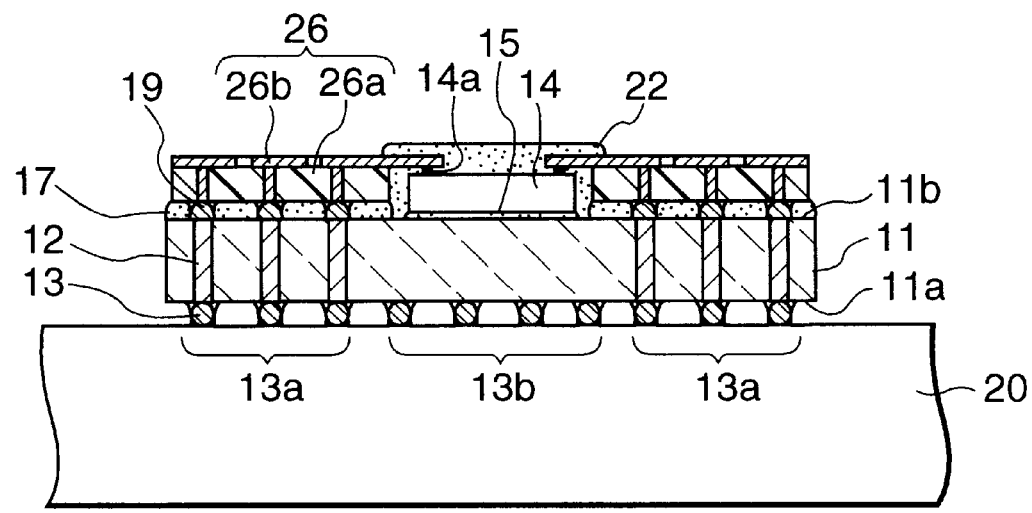
FIG. 6 is a sectional view showing the structure of the semiconductor package according to a modification of the second embodiment of the present invention.
Figure 7:
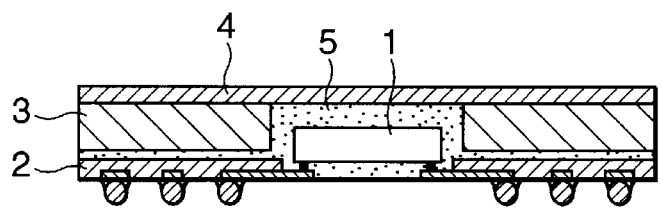
FIG. 7 is a sectional view showing an example of the structure of a package having a conventional TAB chip.

In the second embodiment, an example of which the semiconductor chip 14 and the wiring layer 26b are electrically connected with the bonding wires 18 was explained. However, as shown in FIG. 6, the wiring layer 26b of the TAB tape 26 (namely, the TAB leads) can be electrically connected to the semiconductor chip 14. In other words, in the semiconductor package shown in FIG. 6, as with a conventional TAB tape, the semiconductor chip 14 and the wiring layer (lead lines) 26b are connected through bumps 14a. With the wiring layer 26b of the TAB tape 26 that is electrically connected to the semiconductor chip 14, much more terminals can be connected at narrow pitches.

In addition, as described above, the supporting substrate 11 may be composed of a multi-layered nitride ceramic substrate having a power supply layer, a ground layer, and so forth. With the multi-layered nitride ceramic substrate having only the power supply layer, the ground layer, and so forth besides the via-holes 12, the requirement of the low cost of the semiconductor package can be sufficiently satisfied. In this case, it is preferred that the power supply layer, the ground layer, and so forth are flatly formed in the supporting substrate 11. Thus, the wiring resistance of the power supply layer, the ground layer, and so forth can be decreased. When the power supply layer and the ground layer in the supporting substrate are flatly formed, the wiring layer 26b of the TAB tape 26 are formed as a micro-strip structure. Thus, since the characteristic impedance can be controlled, signals can be prevented from reflecting and ringing. Consequently, with the semiconductor package according to the present invention, the semiconductor chip thereon stably operates at a high frequency of 800 HMz.

In the above-described embodiment, the structure of which the semiconductor chip 14 is bonded and mounted on the upper surface 11b of the supporting substrate 11 was explained. However, the present invention is not limited to such a structure. Instead, a nitride ceramic substrate with a cavity formed in a concave shape can be used for the supporting substrate 11. When the cavity type nitride ceramic substrate is used, the same effects as the package structures shown in FIGS. 4 and 5 can be obtained.

As described above, according to the present invention, the semiconductor package can be simply structured at a low cost. In addition, corresponding to the increase of the number of input/output signals, the package size can be decreased. Moreover, excellent heat radiation characteristic and excellent electric characteristic can be satisfied. According to the present invention, the heat radiation characteristic of the semiconductor mounting device that mounts the semiconductor package can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A thin type semiconductor package having a low thermal resistance and a low electric resistance, comprising:
   a nitride ceramic supporting substrate having a first main surface and a second main surface and a high thermal conductivity, said nitride ceramic supporting substrate having via-holes that pass through from the first main surface to the second main surface;
   a resin film having a wiring layer, said resin film being bonded to the first main surface of said supporting substrate, the wiring layer being electrically connected to an edge portion of the via-holes on the first main surface, said resin film having an opening region;
   a semiconductor chip directly mounted on a semiconductor mounting portion of the first main surface of said nitride ceramic supporting substrate, disposed at the opening portion of said resin film, and electrically connected to the wiring layer of said resin film; and
   a plurality of bumps disposed on the second main surface, the bumps comprising terminal bumps as external connection terminals disposed on the edge portion of the via-holes of the second main surface, and heat radiation dummy bumps to radiate heat from the nitride ceramic supporting substrate.

2. The semiconductor package as set forth in claim 1, wherein the via-holes and the wiring layer of said resin film are electrically connected through the bumps disposed on the first main surface of said nitride ceramic supporting substrate.

3. The semiconductor package as set forth in claim 1, wherein at least one of the heat radiation dummy bumps is disposed on an opposite portion of the second main surface to the semiconductor mounting portion of the first main surface through the nitride ceramic supporting substrate.

4. The semiconductor package as set forth in claim 1, wherein the wiring layer of said resin film is composed of Cu or Cu alloy.

5. A semiconductor mounting device, comprising:
   the semiconductor package of claim 1; and
   a multi-layered mounting substrate for mounting the semiconductor package, said multi-layered mounting substrate having a wiring layer electrically connected to external connection terminals of the semiconductor package.

6. The semiconductor package as set forth in claim 1, wherein the thermal conductivity of the nitride ceramic substrate is of 50 W/m·k or more.

7. A thin type semiconductor package having a low thermal resistance and a low electric resistance, comprising:
   a nitride ceramic, supporting substrate having a first main surface and a second main surface and a high thermal conductivity, said nitride ceramic supporting substrate having via-holes that pass through from the first main surface to the second main surface;
   a TAB tape having a wiring layer bonded to the first main surface of said supporting substrate, the wiring layer being electrically connected to an edge portion of the via-holes on the first main surface;

a semiconductor chip directly mounted on a semiconductor mounting portion of the first main surface of said nitride ceramic supporting substrate, disposed at the opening portion of said TAB tape, and electrically connected to the wiring layer of said TAB tape; and a plurality of bumps disposed on the second main surface, the bumps comprising terminal bumps as external connection terminals disposed on the edge portion of the via-holes of the second main surface, and heat radiation dummy bumps to radiate heat from the nitride ceramic supporting substrate.

8. The semiconductor package as set forth in claim 7, wherein the via-holes and the wiring layer of said TAB tape are electrically connected through the bumps disposed on the first main surface of said nitride ceramic supporting substrate.

9. The semiconductor package as set forth in claim 7, wherein at least one of the heat radiation dummy bumps is disposed on an opposite portion of the second main surface to the semiconductor mounting portion of the first main surface through the nitride ceramic supporting substrate through the nitride ceramic supporting substrate.

10. The semiconductor package as set forth in claim 7, wherein the wiring layer of said TAB tape is composed of Cu or Cu alloy.

11. A semiconductor mounting part, comprising:

the semiconductor package of claim 7; and a multi-layered mounting substrate for mounting the semiconductor package, said multi-layered mounting substrate having a wiring layer electrically connected to external connection terminals of the semiconductor package.

12. The semiconductor package as set forth in claim 6, wherein the thermal conductivity of the nitride ceramic substrate is 50 m·k or more.

* * * * *